(12) United States Patent
Wu et al.

(10) Patent No.: US 12,200,967 B2
(45) Date of Patent: *Jan. 14, 2025

(54) DISPLAY PANEL COMPRISING LIGHT SHIELDING MEMBER ON SIDE OF OPTICAL LAYER AND DISPLAY DEVICE HAVING THE SAME

(71) Applicant: Shanghai Tianma Micro-Electronics Co., Ltd., Shanghai (CN)

(72) Inventors: Yaodong Wu, Shanghai (CN); Yang Zeng, Shanghai (CN); Shucheng Ge, Wuhan (CN); Yu Cai, Wuhan (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/466,313

(22) Filed: Sep. 13, 2023

(65) Prior Publication Data

US 2023/0422549 A1    Dec. 28, 2023

Related U.S. Application Data

(63) Continuation of application No. 17/445,551, filed on Aug. 20, 2021, now Pat. No. 11,805,675.

(30) Foreign Application Priority Data

Jun. 30, 2021    (CN) .......................... 202110739733.7

(51) Int. Cl.
*H10K 59/12*    (2023.01)
*H10K 50/858*    (2023.01)
(Continued)

(52) U.S. Cl.
CPC ......... *H10K 50/858* (2023.02); *H10K 59/126* (2023.02); *G06V 10/145* (2022.01);
(Continued)

(58) Field of Classification Search
CPC .... H10K 50/858; H10K 59/126; H10K 59/65; H01L 25/18
(Continued)

(56) References Cited

U.S. PATENT DOCUMENTS 11,805,675 B2 * 10/2023 Wu ...................... H10K 50/858
2020/0343315 A1   10/2020 Lin et al.
(Continued)

FOREIGN PATENT DOCUMENTS

CN    110399797 A    11/2019
CN    111312792 A    6/2020
(Continued)

*Primary Examiner* — Phuc T Dang
(74) *Attorney, Agent, or Firm* — Anova Law Group, PLLC

(57) ABSTRACT

A display panel includes a substrate; an array layer on the substrate; a display layer located on a side of the array layer away from the substrate, where the display layer includes a plurality of light-emitting devices; an optical layer located on a side of the display layer away from the array layer, wherein the optical layer includes a first optical structure, and at least a portion of the first optical structure is arranged corresponding to intervals between the plurality of light-emitting devices; and a light-shielding member located on a side of the optical layer facing the substrate, where the light-shielding member includes a light pass area, and the light pass area and the first optical structure overlap each other.

23 Claims, 10 Drawing Sheets

(51) Int. Cl.
*H10K 59/126* (2023.01)
*G06V 10/145* (2022.01)
*G06V 40/13* (2022.01)
*H01L 25/18* (2023.01)
*H10K 59/65* (2023.01)

(52) U.S. Cl.
CPC .......... *G06V 40/1318* (2022.01); *H01L 25/18* (2013.01); *H10K 59/65* (2023.02)

(58) Field of Classification Search
USPC .......................................................... 257/91
See application file for complete search history.

(56) References Cited

U.S. PATENT DOCUMENTS

| | | |
|---|---|---|
| 2021/0175468 A1 | 6/2021 | Lee |
| 2022/0181394 A1 | 6/2022 | Moon et al. |

FOREIGN PATENT DOCUMENTS

| | | | | |
|---|---|---|---|---|
| CN | 111725264 A | | 9/2020 | |
| CN | 112379794 A | | 2/2021 | |
| CN | 112530998 A | | 3/2021 | |
| CN | 113054136 A | * | 6/2021 | ......... H01L 27/3232 |
| CN | 113328054 A | * | 8/2021 | ......... H01L 27/3246 |
| KR | 20210072869 A | * | 6/2021 | ......... H10K 50/858 |
| KR | 20220168615 A | * | 12/2022 | ......... H10K 50/858 |

\* cited by examiner

DISPLAY PANEL COMPRISING LIGHT SHIELDING MEMBER ON SIDE OF OPTICAL LAYER AND DISPLAY DEVICE HAVING THE SAME

CROSS-REFERENCE TO RELATED APPLICATION

This application is a continuation of U.S. patent application Ser. No. 17/445,551, filed on Aug. 20, 2021 (Patent No. 11/805,675), which claims the priority of Chinese Patent Application No. 202110739733.7, filed on Jun. 30, 2021, the entire contents of both of which are incorporated by reference.

TECHNICAL FIELD

The present disclosure generally relates to the field of display technology and, more particularly, relates to a display panel and a display device.

BACKGROUND

With the continuous development of science and technology, more and more electronic devices with display functions are widely used in people's daily life and work, and bring great convenience to people such as daily life and work, and become essential tools for people today.

Therefore, there is a need to provide a display device with improved user experience. The disclosed display panels and display devices are directed to solve one or more problems set forth above and other problems in the art.

SUMMARY

One aspect of the present disclosure provides a display panel. The display panel includes a substrate an array layer on the substrate; a display layer located on a side of the array layer away from the substrate, where the display layer includes a plurality of light-emitting devices; an optical layer located on a side of the display layer away from the array layer, where the optical layer includes a first optical structure, and at least a portion of the first optical structure is arranged corresponding to intervals between the plurality of light-emitting devices; and a light-shielding member located on a side of the optical layer facing the substrate, wherein the light-shielding member includes a light pass area, and the light pass area and the first optical structure overlap each other.

Another aspect of the present disclosure provides a display panel. The display panel includes: a substrate; an array layer on the substrate; a display layer located on a side of the array layer away from the substrate, where the display layer includes a plurality of light-emitting devices; and an optical layer located on a side of the display layer away from the array layer, where the optical layer includes a first optical structure, and at least a portion of the first optical structure is arranged corresponding to intervals between the plurality of light-emitting devices. The array layer includes a light pass area, the light pass area and an anode layer of the plurality of light-emitting devices do not overlap, and the light pass area and the first optical structure overlap each other.

Another aspect of the present disclosure provides a display panel. The display panel includes: a substrate; an array layer on the substrate; a display layer located on a side of the array layer away from the substrate, wherein the display layer includes a plurality of light-emitting devices; an optical layer located on a side of the display layer away from the array layer, wherein the optical layer includes a first optical structure, and at least a portion of the first optical structure is arranged corresponding to intervals between the plurality of light-emitting devices; and an optical sensor, disposed on a side of an anode layer of the plurality of light-emitting devices away from the optical layer. The array layer includes a first area, the first area and the anode layer do not overlap, the first area and the first optical structure overlap each other, and the first area and the optical sensor overlap each other.

Other aspects of the present disclosure can be understood by those skilled in the art in light of the description, the claims, and the drawings of the present disclosure.

BRIEF DESCRIPTION OF THE DRAWINGS

The drawings incorporated in the specification and constituting a part of the specification illustrate the embodiments of the present disclosure, and together with the description are used to explain the principle of the present disclosure.

DETAILED DESCRIPTION

Figure 1:
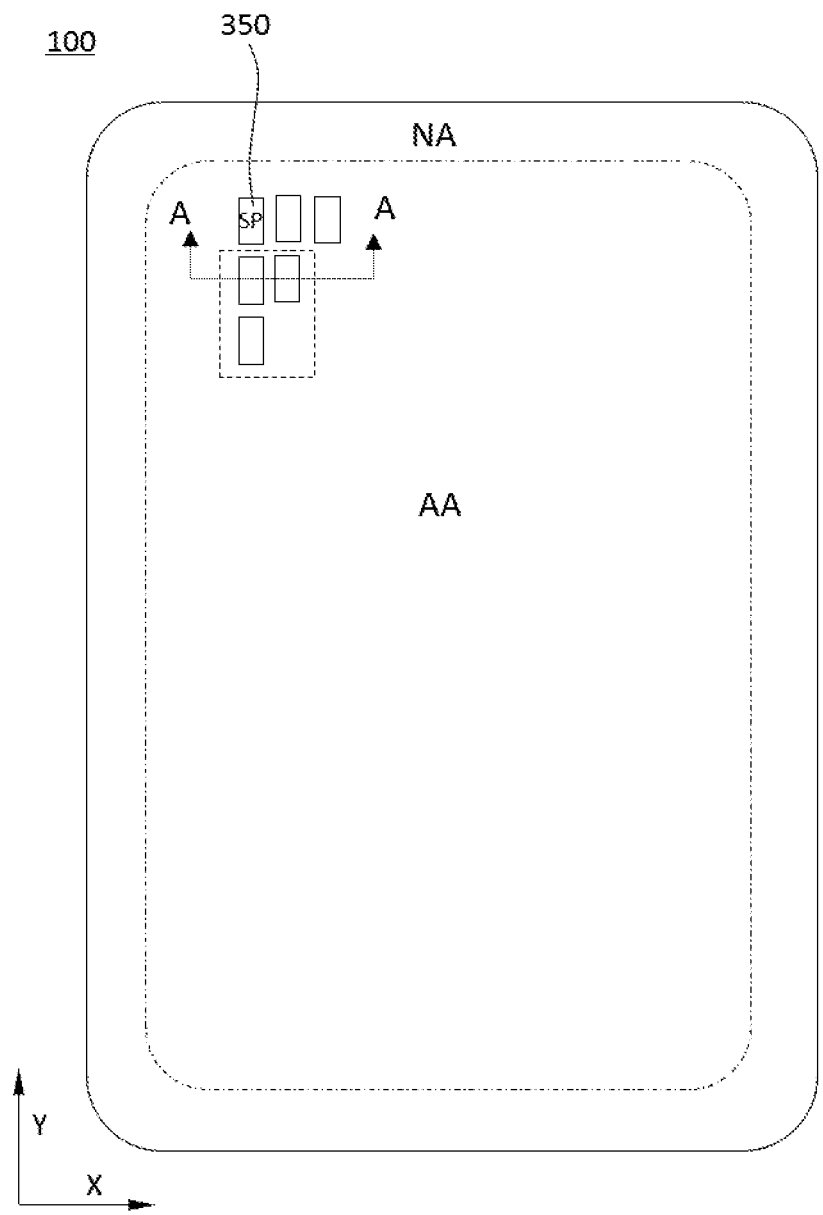
FIG. 1 illustrates a top view of an exemplary display panel according to various disclosed embodiments of the present disclosure.

To make the above-mentioned objects, features and advantages of the present disclosure more obvious and understandable, the present disclosure will be further described below with reference to the accompanying drawings and embodiments.

It should be noted that specific details are set forth in the following description to fully understand the present disclosure. However, the present disclosure can be implemented in many other ways different from those described herein, and those skilled in the art can make similar generalizations without violating the connotation of the present disclosure. Therefore, the present disclosure is not limited by the specific embodiments disclosed below.

The terms used in the embodiments of the present disclosure are only for the purpose of describing specific embodiments, and are not intended to limit the present disclosure. The singular forms of "a", "said" and "the" used in the embodiments of the present disclosure and the appended claims are also intended to include plural forms, unless the context clearly indicates other meanings.

It should be noted that the "upper", "lower", "left", "right" and other directional words described in the embodiments of the present disclosure are described from the angle shown in the drawings, and should not be construed as limitations of examples implementing the present disclosure. In addition, in the context, it should also be understood that when it is mentioned that an element is formed "on" or "under" another element, it can not only be directly formed "on" or "under" the other element, but also it is formed "on" or "under" another element indirectly through an intermediate element.

Moreover, the example embodiments can be implemented in various forms, and should not be construed as being limited to the embodiments set forth herein; on the contrary, the provision of these embodiments makes the present disclosure more comprehensive and complete, and fully conveys the concept of the example embodiments to those skilled in the art. The same reference numerals in the figures indicate the same or similar structures, and thus their repeated description will be omitted. The words expressing position and direction described in the present disclosure are all illustrated by taking the drawings as examples, but changes can also be made according to needs, and the changes made are all included in the protection scope of the present disclosure. The drawings of the present disclosure are only used to illustrate the relative position relationship, and the layer thicknesses of some parts are drawn in an exaggerated way for easy understanding. The layer thicknesses in the drawings do not represent the proportional relationship of the actual layer thicknesses, and in the case of no conflict, the embodiments of the present disclosure and the features in the embodiments can be combined with each other. The drawings of the embodiments in this application use the same reference numerals. In addition, the similarities between the embodiments will not be repeated.

Figure 2:
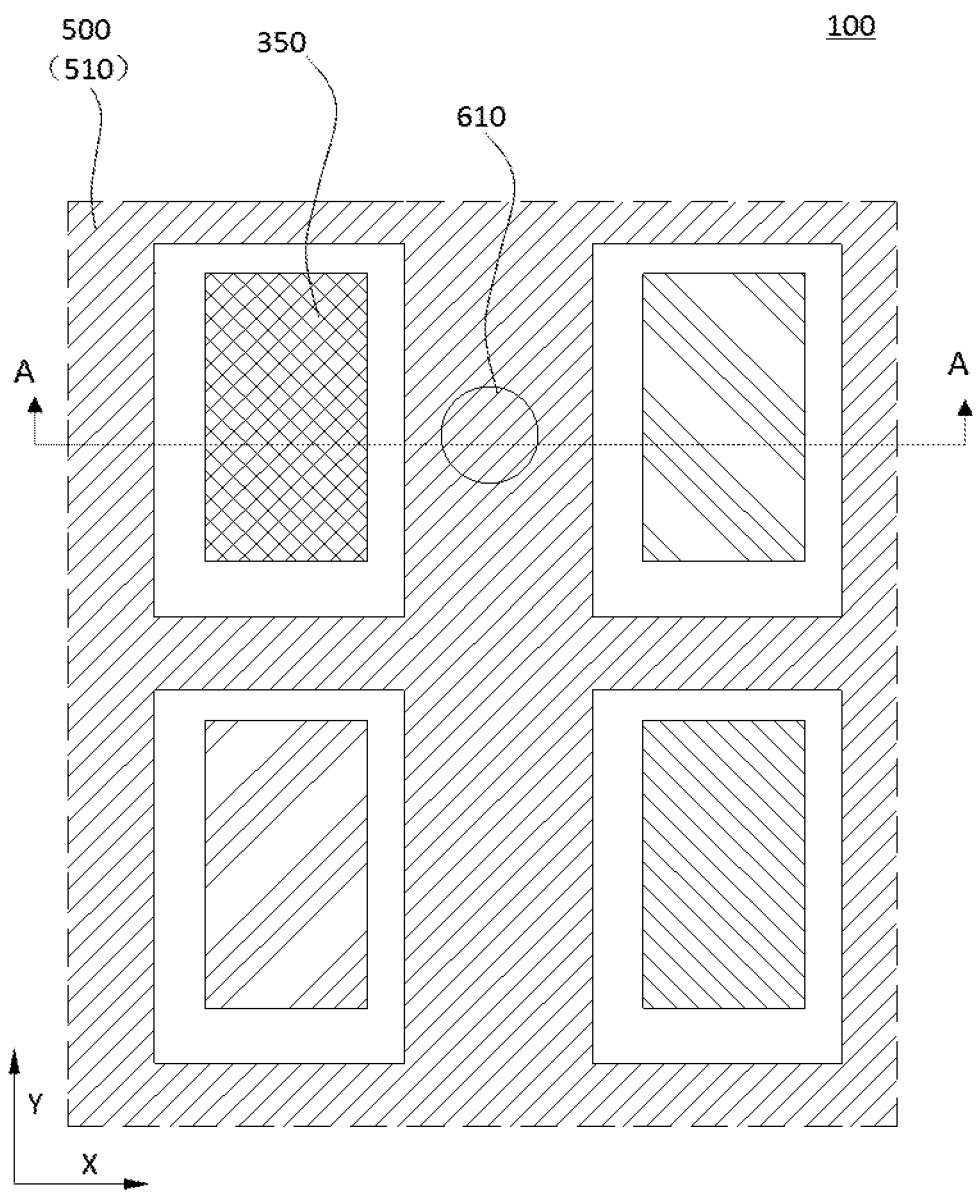
FIG. 2 illustrates a partially zoomed-in view of FIG. 1.
Figure 3:
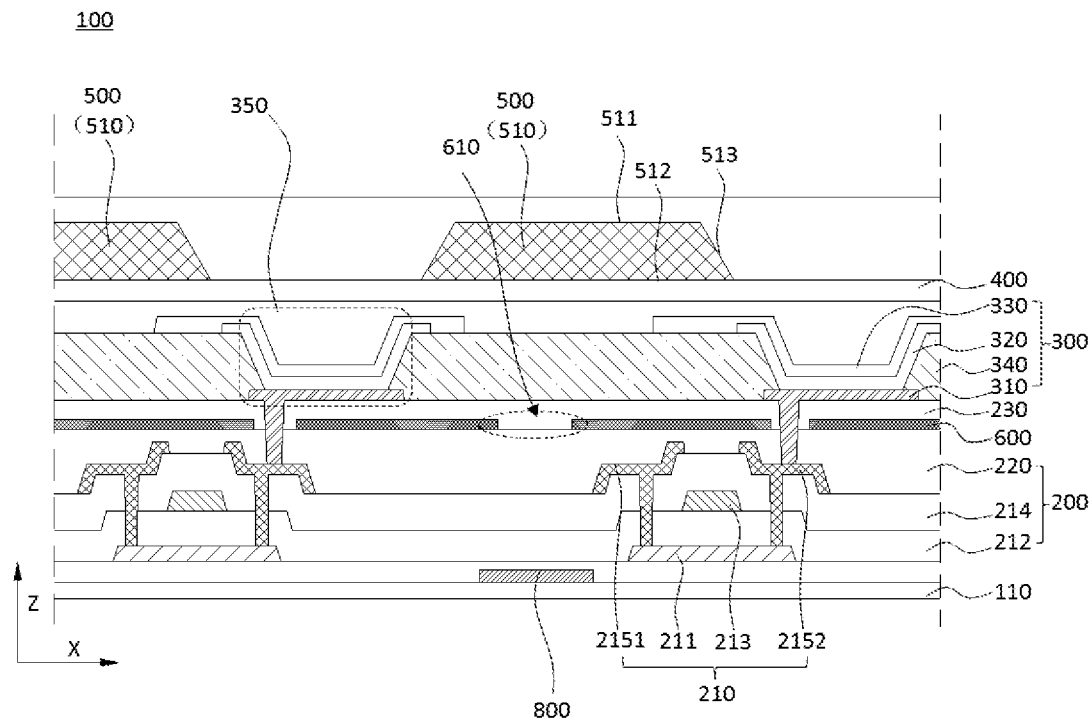
FIG. 3 illustrates an A-A sectional view of a portion of the display panel in FIG. 1 or FIG. 2.

The present disclosure provides a display panel and a display device. FIGS. 1-3 illustrate an exemplary display panel according to various disclosed embodiments of the present disclosure. FIG. 1 is a top view of the exemplary display panel provided by an embodiment of the present disclosure, FIG. 2 is a partial enlarged view of FIG. 1 (i.e., the area shown by the dashed frame in FIG. 1), and FIG. 3 is an A-A-sectional view in FIG. 1 or FIG. 2. The cross-section may be perpendicular to the plane where the display panel is located.

It is understandable that the cross section shown in this application can be defined as a first cross-section. The first cross-section may be parallel to a first direction X, perpendicular to a second direction Y, and parallel to a third direction Z. In another embodiment, the second direction Y is parallel to the plane where the display panel 100 is located, perpendicular to the first direction X, and perpendicular to the third direction Z.

In one embodiment, the display panel 100 may be divided into a display area AA and a non-display area NA surrounding the display area AA. It is understandable that the dot-line dashed frame in FIG. 1 is used to indicate the boundary of the display area AA and the non-display area NA The display area AA may be the area used by the display panel to display images and may usually include a plurality of pixel units arranged as an array. Each pixel unit may include a corresponding light-emitting device (for example, a diode) and a control element (for example, thin-film transistors constituting a pixel drive circuit). The non-display area NA may surround the display area AA, and may usually include peripheral driving components, peripheral wirings, and fan-out area, etc.

The display panel 100 may include a substrate 110. The substrate 110 (i.e., the base substrate) may be flexible such that it may be stretched, foldable, bendable, or rollable to allow the flexible display panel to be stretchable, foldable, bendable, or rollable. The substrate 110 may be of any suitable insulating material having flexibility. The substrate 110 may be used to block oxygen and moisture, prevent moisture or impurities from diffusing through the flexible substrate, and provide a flat surface on the upper surface of the flexible substrate. For example, the substrate may be made of polyimide (PI), polycarbonate (PC), polyethersulfone (PES), polyethylene terephthalate (PET), polyethylene naphthalate (PEN), polyarylate (PAR), glass fiber reinforced plastic (FRP), and other polymer materials. The substrate 110 may be transparent, translucent, or opaque. In one embodiment, the display panel may further include a buffer layer (not shown in the figure) on the substrate 110, and the buffer layer may cover the entire upper surface of the substrate.

The display panel may also include an array layer 200 disposed on the substrate 110. For example, the array layer 200 may be disposed on the side of the substrate 110 facing the display surface or the touch surface of the display panel 100. The array layer 200 may include a plurality of thin-film transistors (TFTs) 210 and pixel circuits formed by the thin-film transistors to be used as the light-emitting devices in the display layer.

The embodiment of the present disclosure takes a top-gate thin film transistor as an example for structural description. A thin-film transistor 210 may include an active layer 211 on the substrate 110. The active layer 211 may be an amorphous silicon material, a polysilicon material, or a metal oxide material, etc. When the active layer 211 is made of polysilicon material, it may be formed by low-temperature amorphous silicon technology. For example, the amorphous silicon material may be melted by the laser to form a polysilicon material. In addition, various methods, such as rapid thermal annealing (RTA), solid phase crystallization (SPC), excimer laser annealing (ELA), metal-induced crystallization (MIC), metal-induced lateral crystallization (MILC), or continuous lateral curing (SLS) method, etc., may also be used to form the active layer 211. The active layer 211 may further include a source region and a drain region formed by doping N-type impurity ions or P-type impurity ions. A channel region may be formed between the source region and the drain region.

The thin-film transistor may also include a gate insulation layer 212 on the active layer 211. The gate insulation layer 212 may include an inorganic layer, such as silicon oxide, or silicon nitride, etc., and may include a single layer or multiple layers.

Further, the thin-film transistor may include a gate electrode 213 formed on the gate insulation layer 212. The gate electrode 213 may be made of a single layer material or a multiple layer material including one or more of gold (Au), silver (Ag), copper (Cu), nickel (Ni), platinum (Pt), palladium (Pd), aluminum (Al), molybdenum (MO), or chromium (Cr). The gate electrode 213 may also be made of an alloy, such as aluminum (Al): neodymium (Nd) alloy, or molybdenum (MO): tungsten (W) alloy, etc.

Further, the thin-film transistor may include an interlayer insulation layer 214 formed on the gate electrode 213. The interlayer insulation layer 214 may be made of an insulating inorganic layer, such as silicon oxide or silicon nitride, etc. In some embodiments, the interlayer insulation layer may be made of an organic insulating material.

Further, the thin-film transistor may include a source electrode 2151 and a drain electrode 2152 formed on the interlayer insulation layer 214. The source electrode 2151 and the drain electrode 2152 may be electrically connected (or coupled) to the source region and the drain region through contact holes. The contact holes may be formed by selectively removing the gate insulation layer 212 and the interlayer insulation layer 214.

The array layer 200 may further include a passivation layer 220. In one embodiment, the passivation layer 220 may be formed on the source electrode 2151 and the drain electrode 2152 of the thin-film transistor 210. The passivation layer 220 may be made of an inorganic material, such as silicon oxide, or silicon nitride, etc., or may be made of an organic material.

The display panel 100 may further include a planarization layer 230. In one embodiment, the planarization layer 230 may be disposed on the passivation layer 220. The planarization layer 230 may include organic materials such as acrylic, polyimide (PI) or benzocyclobutene (BCB), etc., and the planarization layer 230 may have a planarization effect.

In one embodiment, the display panel 100 may further includes a display layer 300 on the side of the array layer 200 away from the substrate 110. The display layer 300 may include a plurality of light-emitting devices 350. In one embodiment, the display layer 300 may be located on the planarization layer 230. The display layer 300 may include an anode layer 310, an organic light-emitting material layer 320, and a cathode layer 330 that are sequentially arranged along a direction away from the substrate 110. The display layer 300 may further include a pixel definition layer 340 on the side of the anode layer 310 away from the array layer 200. The pixel definition layer 340 may be made of an organic material such as polyimide (PI), polyamide, benzocyclobutene (BCB), acrylic resin, or phenol resin, or an inorganic material such as SiNx.

In one embodiment, the anode layer 310 may include a plurality of anode patterns corresponding to the pixels on a one-to-one correspondence, and the anode patterns in the anode layer 310 may be connected to the source electrode 2151 or the drain electrode 2152 of the thin-film transistor 210 through the via hole on the planarization layer 230. The pixel definition layer 340 may be located on a side of the anode layer 310 away from the substrate 110 and may include a plurality of openings exposing the anode layer 310. The pixel definition layer 340 may cover the edges of the patterns of the anode layer 310. The organic light-emitting material layer 320 may be at least partially filled in the opening of the pixel definition layer 340 and may be in contact with the anode layer 310.

In one embodiment, the anode layer 310, the organic light-emitting material layer 320, and the cathode layer 330 defined by the opening of each pixel definition layer 340 may constitute a light-emitting device 350 (as shown in the dashed box in FIG. 3), and each light-emitting device 350 may emit light of different colors according to different organic light-emitting material of the light-emitting material layer 320. Each light-emitting device 350 may constitutes a pixel sp (in other words, each light-emitting device 350 and the pixel circuit that controls the light-emitting device 350 may jointly constitute a pixel), and multiple pixels may together display a picture.

In one embodiment, the organic light-emitting material layer 320 may be formed in the opening of the pixel definition layer 340 by using methods such as inkjet printing, nozzle printing, or evaporation. The cathode layer 330 may be formed on the film layer where the organic light-emitting material layer 320 is located by an evaporation process. In one embodiment, the cathode layer 330 may also cover the entire surface of the organic light-emitting material layer 320 and the pixel definition layer 340.

In one embodiment, the display panel 100 may further include an encapsulation layer 400 on the display layer 300. The encapsulation layer 400 may completely cover the display layer 300 to seal the display layer 300. It is understandable that some "on" mentioned in this embodiment may be understood as being "on the side far from the substrate". In one embodiment, the encapsulation layer 400 is a thin-film encapsulation layer, disposed on the cathode layer 330, and including a first inorganic encapsulation layer, a first organic encapsulation layer, and a second inorganic encapsulation layer sequentially arranged along a direction away from the substrate 110. In some optional embodiments of the present disclosure, the encapsulation layer may include any number of stacked organic materials and inorganic materials, but at least one layer of organic material and at least one layer of inorganic material may be deposited alternately, and the lowermost layer and the uppermost layer may be made of inorganic materials.

In one embodiment, the display panel 100 may further include an optical layer 500 located on a side of the display layer 300 away from the array layer 200. The optical layer 500 may include a first optical structure 510, and the first optical structure 510 and the corresponding the light-emitting device 350 may be disposed with a certain interval. A light extraction structure may be formed by the first optical structure 510, which may play a role in improving the extraction efficiency of light emitted from the direction of the normal viewing angle.

In one embodiment, the first optical structure 510 may include a transparent inorganic material or a transparent organic material. For example, the inorganic material may include silicon oxide or magnesium fluoride; and the organic material may include at least one of PI, polyamide, and tris(8-quinolinyl) aluminum (Alq3), etc.

In one embodiment, the first optical structure 510 may be formed by a photolithography process.

In one embodiment, the vertical projection of the first optical structure 510 on the plane where the substrate 110 is located may be located between the vertical projections of the adjacent light-emitting devices 350 on the plane where the substrate 110 is located such that the first optical structure 510 may form a structure surrounding the light-emitting device 350. Such a configuration may more comprehensively receive the large viewing angle light emitted by the light-emitting device 350, reduce the divergence angle of the large viewing angle light, and improve the light extraction efficiency.

In one embodiment, the display panel 100 may further include a first light-shielding member 600 located on the side of the optical layer 500 facing the substrate 110. In another embodiment, the first light-shielding member 600 may be located in the array layer 200.

In one embodiment, the first light-shielding member 600 may be made of a shading material. In another embodiment, the first light-shielding member 600 may be made of a metal material. In another embodiment, the first light-shielding member 600 may be formed by multiplexing other metal layers in the display panel 100.

In one embodiment, the first light-shielding member 600 may form a light pass opening 610 penetrating the first light-shielding member 600. The light pass opening 610 may allow the light reflected from the touch surface to pass through the first light-shielding member 600 and be detected by the detection component.

In one embodiment, the display panel 100 may further include a light sensor layer 800. The light sensor layer 800 may be located on a side of the first light-shielding member 600 away from the optical layer 500, and may be used for detecting image formed by the light pass opening 610.

If light enters the first optical structure from the bottom surface of the first optical structure, it may be reflected back by the first optical structure and enter the array layer, which may cause damage to the driving device, especially the thin-film transistor. In the present disclosure, the first light-shielding member 600 may help the first optical structure 510 to improve its structural reliability, intercept the light reflected by the first optical structure, and consume the light between the first optical structure and the first light-shielding member 600. Therefore, the light reflected by the first optical structure 510 may be prevented from entering the array layer, and other problems caused by the introduction of the first optical structure 510 may be avoided.

Further, the light pass opening 610 may overlap the first optical structure 510. Through such a design, the optical pickup function of the first optical structure may be used to assist the light pass opening 610 to receive light, which may be beneficial to improving the light-capturing ability of the light pass opening.

In one embodiment, the orthographic projection of the first optical structure 510 on the substrate 110 may completely cover the orthographic projection of the light pass opening 610 on the substrate 110. Because the first optical structure may not cover the entire surface of the display panel, through such a design, the light with the pattern information of the touch body that needs to be received by the light pass opening 600 may not be affected by the patterned first optical structure.

In some other optional embodiments of the present disclosure, the display panel may further include a protective layer (not shown in the figure) on the optical layer 500. In one embodiment, the protective layer is the outermost film layer of the display panel, which may be a protective cover plate or a cover film. The protective layer may be bonded to the inner film layer of the adjacent display panel through an optically clear adhesive (OCA).

In some other optional embodiments of the present disclosure, the display panel may further include a color filter layer (not shown in the figure) on the side of the display layer away from the array layer. In some embodiments, the color filter layer may also be located on the side of the optical layer away from the array layer.

In one embodiment, the color filter layer may include a black matrix (BM) and a color resist. The black matrix may have a mesh structure, the meshes of the mesh structure may be arranged corresponding to the light-emitting devices, and one mesh may define one color resist. The color resists of different colors may be separated by the light-shielding layer. The color resists and the light-emitting devices may be arranged in a one-to-one correspondence. The color resists may include color resists of different colors, and the color resists corresponding to each other may be same as the color of the light-emitting device. The black matrix may include a light pass channels corresponding to the light-sensing detection light source.

Through the above-mentioned embodiments, by incorporating different structures, while realizing the integrated display and light sensing functions, the light extraction structure may improve the display effect while also increasing the light sensing detection effect. The light-shielding layer may help the light extraction structure to avoid other risk problems caused by its introduction while realizing the light sensing detection. Thus, the present disclosure may further improve the quality of the imaged picture while further improving the light sensing while achieving functional integration. The risk problems that may be caused by the introduction of a specific structure may be avoided.

Figure 4:
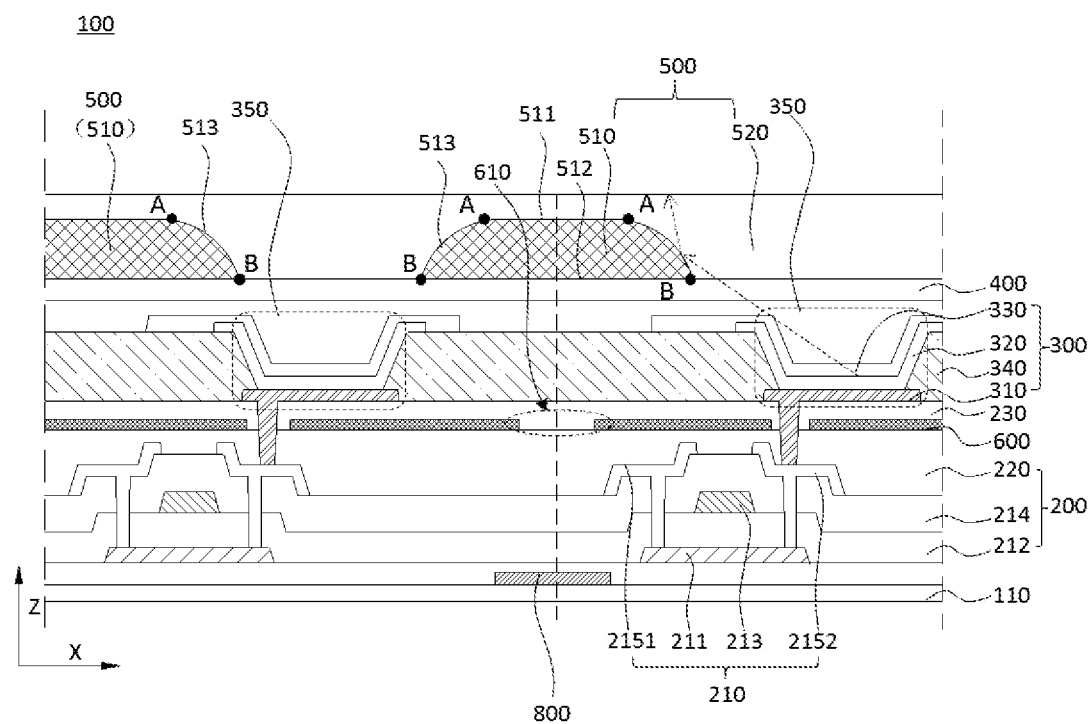
FIG. 4 illustrates another A-A sectional view of a portion of the display panel in FIG. 1 or FIG. 2

FIG. 4 is another exemplary A-A sectional view a portion of the structure FIG. 1 or FIG. 2. Referring to FIG. 3 and FIG. 4, in one embodiment, the light pass opening 610 and the sidewall 513 of the first optical structure 510 may not overlap. For example, the first optical structure 510 may include a top surface 511 adjacent to the light-exiting surface of the display panel 100, a bottom surface 512 away from the light-exiting surface of the display panel 100, and sidewalls 513 connected between the top surface 511 and the bottom surface 512.

In one embodiment, the sidewall 513 may be an inclined sidewall. For example, it may not be parallel to the third direction Z. The projection of the sidewall 513 on the substrate 110 may have a non-zero length along the first direction X.

In one embodiment, the first direction X may be a direction parallel to the cross-sectional direction shown in the figure. In another embodiment, the first direction X may be a direction parallel to the light pass opening 610 and pointing to the adjacent light-emitting device 530.

In one embodiment, the orthographic projection of the light pass opening 610 on the substrate 110 and the orthographic projection of the sidewall 513 on the substrate 110 may not overlap. In another word, the orthographic projection of the light pass opening 610 on the substrate 110 may completely fall within the coverage of the orthographic projection of the top surface 511 of the first optical structure 510 on the substrate 110.

The sidewall 513 of the first optical structure 510 may be an inclined surface. Thus, the thickness of the first optical structure 510 in the sidewall 513 area of the first optical structure 510 may vary, and the thickness direction may be the third direction Z. The present embodiment may prevent the thickness of the sidewall area of the first optical structure from affecting the light information captured by the light pass opening. Further, to reduce the manufacturing cost, the sidewall of the first optical structure may be generally inclined toward the inside of the first optical structure along the direction in which the substrate points to the light-emitting surface of the display panel. For example, the bottom surface of the first optical structure may be greater than the top surface of the first optical structure, and the orthographic projection of the top surface of the first optical structure on the substrate may completely fall within the orthographic projection of the bottom surface of the first optical structure on the substrate. Therefore, the light that enters the interior of the first optical structure from the bottom surface of the first optical structure may be more concentratedly reflected to the bottom surface below the sidewall through the sidewall. Therefore, the design of this embodiment may further improve the accuracy of light sensing detection, and prevent the detection accuracy of itself from being affected when the light-shielding layer assists the first optical structure.

Further, referring to FIG. 3 or FIG. 4, in one embodiment, the first optical structure 510 and the light-emitting device 350 may not overlap. For example, along a direction perpendicular to the plane where the display panel 100 is located (i.e., the third direction Z in the present disclosure), the projections of the first optical structure 510 and the light-emitting device 350 may not overlap.

In one embodiment of the present disclosure, the boundary of the light-emitting device 350 may be the boundary of the organic light-emitting material layer 320 located in the opening of the pixel definition layer 340.

In some embodiments, the edge of the opening of the pixel definition layer may be defined as the boundary of the light-emitting device as required. For the opening of the pixel definition layer with inclined sidewalls, the boundary of the opening may be defined as being defined by the boundary of the opening at its middle level position.

The non-overlapping of the first optical structure 510 and the light-emitting device 350 in the present embodiment may mean that at least the first optical structure 510 corresponding to the light pass opening 610 and the light-emitting device 350 may not overlap. In another word, the edge of the light-emitting device 350 adjacent to the light opening 610 may not overlap with the first optical structure 510. The light-emitting device 350 that is not adjacent to the light pass opening 610 or the edge of the light-emitting device 350 that is not adjacent to the light pass open may not be subject to the above limitation. In other embodiments of the present disclosure, all the first optical structures may not overlap with any position of the light-emitting device as required.

In one embodiment, as little as possible light may be incident into the optical structure from the bottom surface of the first optical structure to further prevent the light incident on the first optical structure from being reflected by the sidewall. Accordingly, the accuracy of optical detection may be improved.

Referring to FIG. 4, in some embodiments of the present disclosure, the optical layer 500 may further include a second optical structure 520. The second optical structure 520 may be setup corresponding to the first optical structure 510 and the light-emitting device 350 set up. For example, the second optical structure 520 may be disposed on the side of the first optical structure 510 away from the display layer 300, or on the sidewall of the first optical structure 510 facing the light-emitting device 350, or on the side of the light-emitting device 350 away from the substrate 110, and may cover the light emitting device 350.

For illustrative purpose, in one embodiment, the configuration that the second optical structure 520 is a structure that is located on the side of the first optical structure 510 away from the display layer 300 and covers the entire surface of the light-emitting device 350 is used as an example for description.

In one embodiment, the second optical structure 520 may include a transparent inorganic material or a transparent organic material with a high refractive index. For example, the inorganic material may include at least one of zinc oxide, titanium oxide, zirconium oxide, niobium oxide, tantalum oxide, tin oxide, nickel oxide, silicon nitride, indium nitride, or gallium nitride. The organic material may include at least one of triphenylamine (m-MTDATA), 1,3,5-tris[N,N-bis(3-methylphenyl)-amino]-benzene (m-MTDAB), 4,4'-bis(N,N-bis(3-methylphenyl)-amino]-diphenylmethane (BPPM), 2,2',2"-(1,3,5-phenylmethylphenyl)tris[1-phenyl-1H-benz-imidazole] (TPBI), and 3-(4-biphenyl)-4-phenyl-5-tert-butylphenyl-1,2,4-triazole (TAZ). The materials of the first optical structure 510 and the second optical structure 520 may include but are not limited to the above examples, and the materials of the first optical structure 510 and the second optical structure 520 may be chosen according to actual conditions.

By adjusting the refractive index n1 of the first optical structure 510 and the refractive index n2 of the second optical structure 520, for example, n1 may be 1.5 and n2 may be in a range of 1.7-1.8, the interface between the first optical structure 510 and the second optical structure 520 may have a relatively high reflectivity. Accordingly, when the light emitted by the light-emitting device 350 reaches the surface of the first optical structure 510, it may be totally reflected and emitted along the direction adjacent to the front viewing angle of the display panel (as shown by the dashed arrow in FIG. 4). The large-angle light emitted by the light-emitting device 350 may be more converted into small-angle light, and the light extraction efficiency may be increased. Thus, more light may be emitted from right direction of the light-emitting device 350 and its vicinity.

Further, referring to FIG. 3 or FIG. 4, the sidewall 513 of the first optical structure 510 may be a non-concave surface. In this way, the light extraction capability of the optical layer 500 may be further improved, and the display effect may be improved.

Further, as shown in FIG. 4, the sidewall 513 of the first optical structure 510 may be a convex arc surface. In another word, the side wall 513 may protrude along a direction away from the inside of the first optical structure 510. In this way, for the sidewall, the closer the convex arc surface is to the light-emitting surface of the display panel, the larger the slope angle corresponding to the sidewall is, which may be more conducive to the total reflection; and the process difficulty may also be reduced.

Moreover, for the light emitted from the same position, if it is a light with a particularly large viewing angle, it may be likely to irradiate the sidewall closer to the bottom surface of the first optical structure. At this time, the incident angle of the light relative to the sidewall may be more difficult to satisfy the full range. Under the reflection condition, there may be a high probability of being absorbed by the first optical structure. When the angle of view is not too large, when the light is incident on the sidewall, the incident position may be the side wall closer to the top surface of the first optical structure, the inclination angle of the sidewall may be larger, and it may be easier to satisfy the total reflection condition relative to the incident light. Thus, it may be easy to realize the total reflection. That is to say, the first optical structure designed in this embodiment may further filter the large viewing angle light, and extract the large viewing angle light with better conditions. Thus, the display effect may be further improved.

Figure 5:
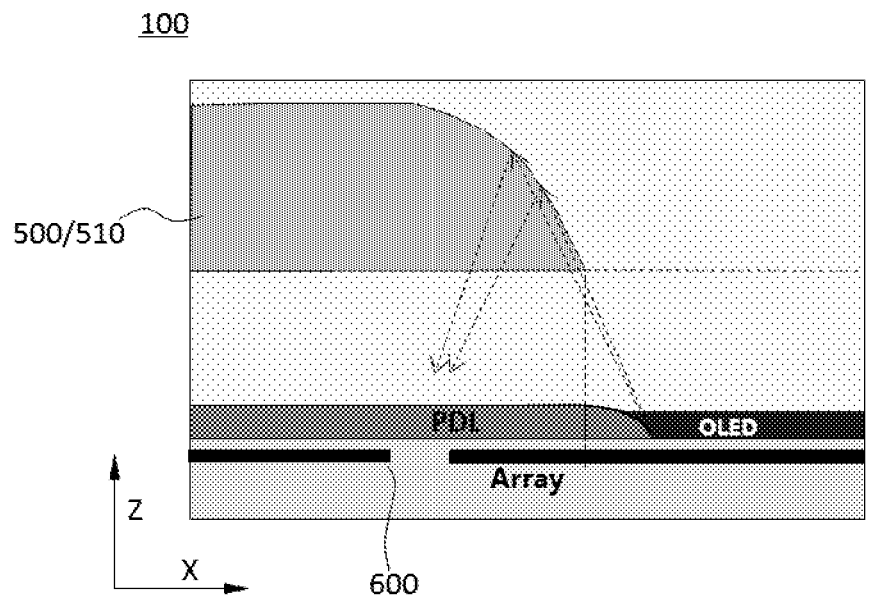
FIG. 5 illustrates a cross-sectional view of a portion of a display panel.

FIG. 5 is a schematic partial cross-sectional view of a display panel. Referring to FIG. 5, when the sidewall of the first optical structure is designed as a convex arc surface, the sidewall is equivalent to a concave mirror for the light that penetrates the bottom surface of the first optical structure and enters the surface of the sidewall. At this time, the sidewall has a converging effect on the light incident on it, and will converge this type of light near the light pass opening, and even converge to the light pass opening, and this type of light is not reflected by the touch subject with touch information. Therefore, it will affect the light detection results. That is to say, the reflected light at the edge of the opening of the first optical structure will fall into the imaging acquisition area, which will generate fixed pattern noise and greatly reduces the signal-to-noise ratio. In addition, for the approach that the light-emitting layer includes the first optical structure and the second optical structure, the interface position between the low refractive index layer and the high refractive index layer may have a high reflectivity, and since the interface position may have a certain curvature, it is easier to form the effect of a concave mirror to converge the reflected light to or around the light opening. Thus, the base noise of the image and the interference may be increased.

Figure 6:
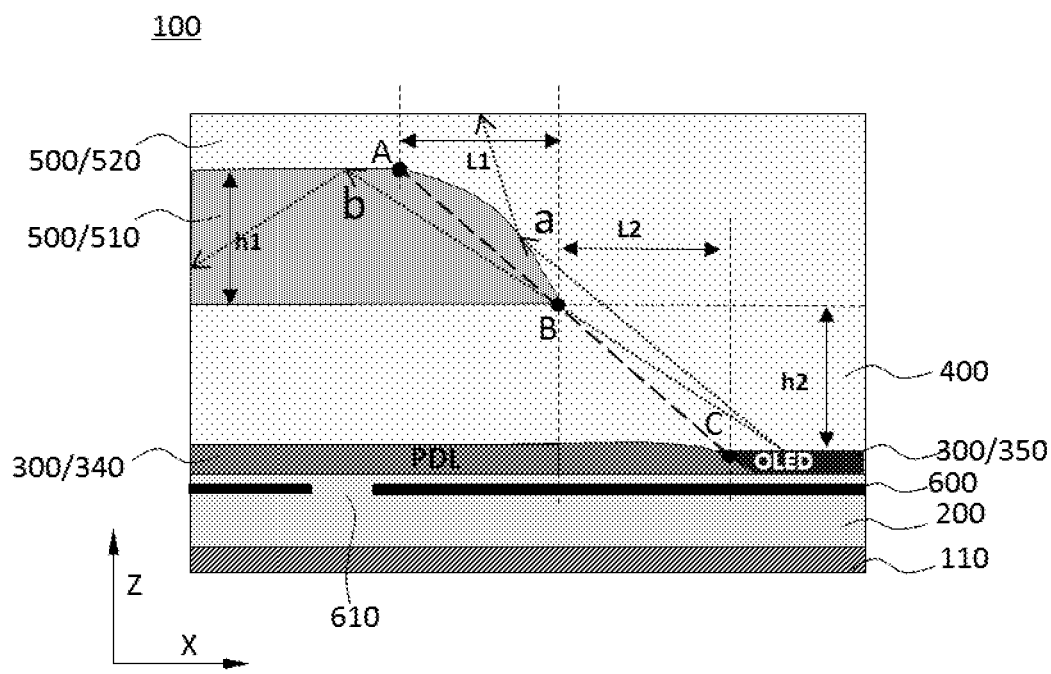
FIG. 6 illustrates another exemplary cross-sectional view of a display panel according to various disclosed embodiments of the present disclosure.
Figure 7:
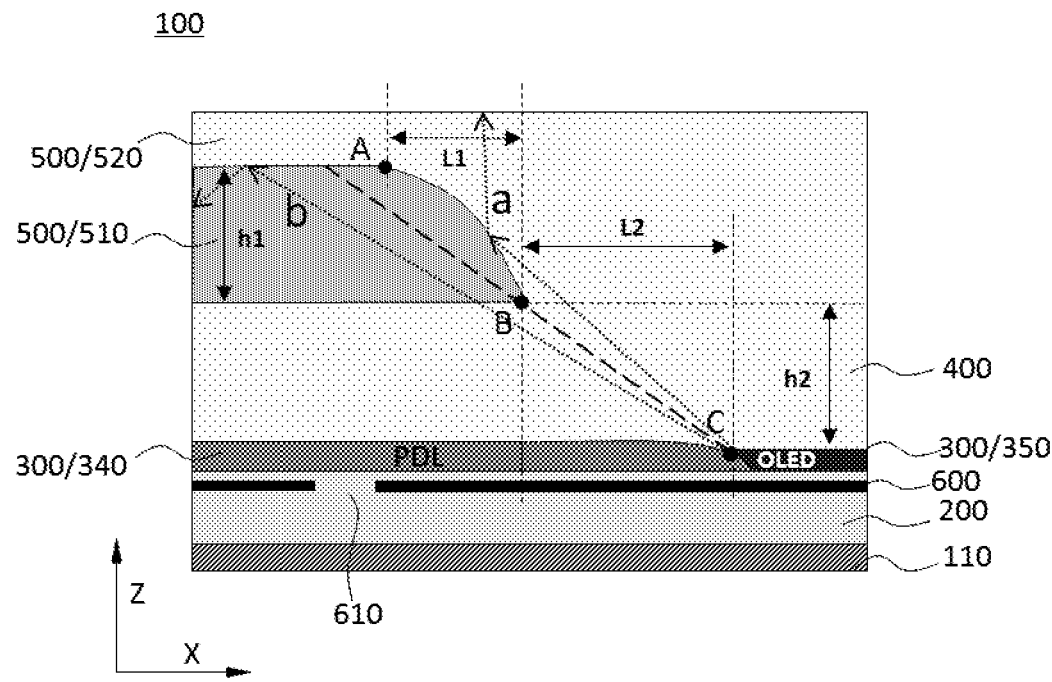
FIG. 7 illustrates another exemplary cross-sectional view of a display panel according to various disclosed embodiments of the present disclosure.

FIG. 6 and FIG. 7 are respectively other exemplary partial cross-sectional schematic diagrams according to various disclosed embodiments of the present disclosure. FIGS. 1-4 and FIGS. 6-7 may be combined together to under the present disclosure.

As shown in FIGS. 6-7, the sidewall 513 of the first optical structure 510 may include an upper end A adjacent to the light-exiting surface (i.e., the touch surface) of the display panel 100 and a lower end B away from the light-exiting surface of the display panel 100. The upper end A of the sidewall 513 may be the position where the sidewall 513 meets the top surface 511 of the first optical structure 510; and may be equivalent to the boundary of the top surface 511. Similarly, the lower end B of the sidewall 513 may be the position where the sidewall 513 meets the bottom surface 512 of the first optical structure 510; and may be equivalent to the boundary of the bottom surface 512.

The extension line of the connection line B-C between the lower end B and the light-emitting device 350 may be a first extension line (i.e., the dashed line extended along the line B-C in the figure). In one embodiment, the upper end A may be located on the first extension line (as shown in FIG. 6). In another embodiment, the upper end A may be located on the side of the first extension line facing the light-exiting surface of the display panel 100 (as shown in FIG. 7). For example, the upper end A may be located at the upper right of the dotted line in FIG. 7.

Through such a design, the light emitted by the light-emitting device may be prevented from irradiating the inner side of the sidewall (i.e., the side of the sidewall facing the inner side of the first optical structure), and the light emitted by the light-emitting device may either resemble the dotted arrow a in the figure, and may be totally reflected out of the display panel by the outer surface of the sidewall of the first optical structure; or may be incident on the inner surface of the top surface like the light b indicated by the dotted arrow in the figure. Accordingly, without affecting the light extraction effect of the optical layer, the interference light reflected by the sidewall may be prevented from converging to the light pass opening and its vicinity. Thus, while ensuring the light extraction effect, the accuracy of the optical detection may be improved.

Further, referring to FIG. 6 or FIG. 7, in one embodiment, in the case of taking into account the pixel density, to optimize the improvement effect, the first extension line may be an extension line of the connection line between the point on the light-emitting device 350 closest to the optical structure 510 (i.e., the point C in the figure, that is, the edge of the light-emitting device 350) and the lower end B.

In one embodiment, the distance between the first optical structure 510 and the light-emitting device 350 may be L2. L2 may be the horizontal distance from the lower end B to the edge of light-emitting device 350 closest to the lower end B.

In one embodiment, L2 may satisfy $L2 \geq h2 \times L1/h1$. L1 may be the horizontal distance from the upper end A to the lower end B of the sidewall 513 of the first optical structure 510, h1 may be the thickness of the first optical structure 510, and h2 may be the vertical distance from the light-emitting device 350 to the optical structure 510. Through the above design, the effect of optical detection may be more effectively improved.

It should be noted that the horizontal distance in this embodiment may be the distance along the first direction X. The horizontal distance from the upper end A of the sidewall 513 to the lower end B may be understood as the length of the projection of the sidewall 513 on the substrate 110 along the first direction X. The thickness of the first optical structure 510 in this embodiment may be its size along the third direction Z. The vertical distance in this embodiment may be the distance along the third direction Z. The vertical distance from the light-emitting device 350 to the first optical structure 510 may be understood as the distance between the plane where the light-emitting device 350 is located and the plane where the first optical structure 510 is located. The "plane" where the light-emitting device 350 is located may be parallel to the plane where the display panel 100 is located.

In one embodiment, $L2 = h2 \times L1/h1$. Such a configuration may ensure that the sidewall may not affect the optical detection while considering the pixel density such that the effect of the matching effect of the optical structure, the light-shielding layer and the light pass opening may be optimized.

Figure 8:
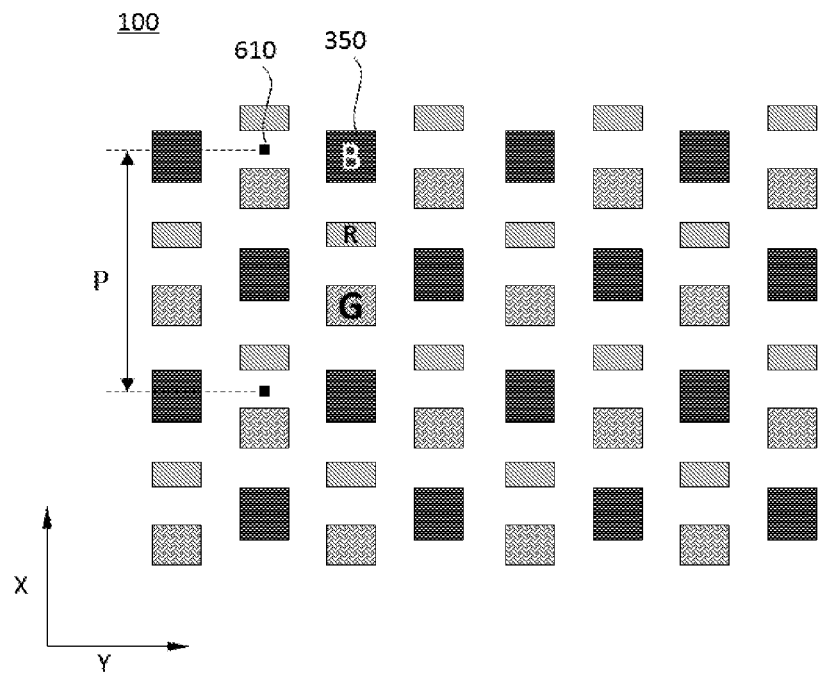
FIG. 8 illustrates a top view of another exemplary display panel according to various disclosed embodiments of the present disclosure.
Figure 9:
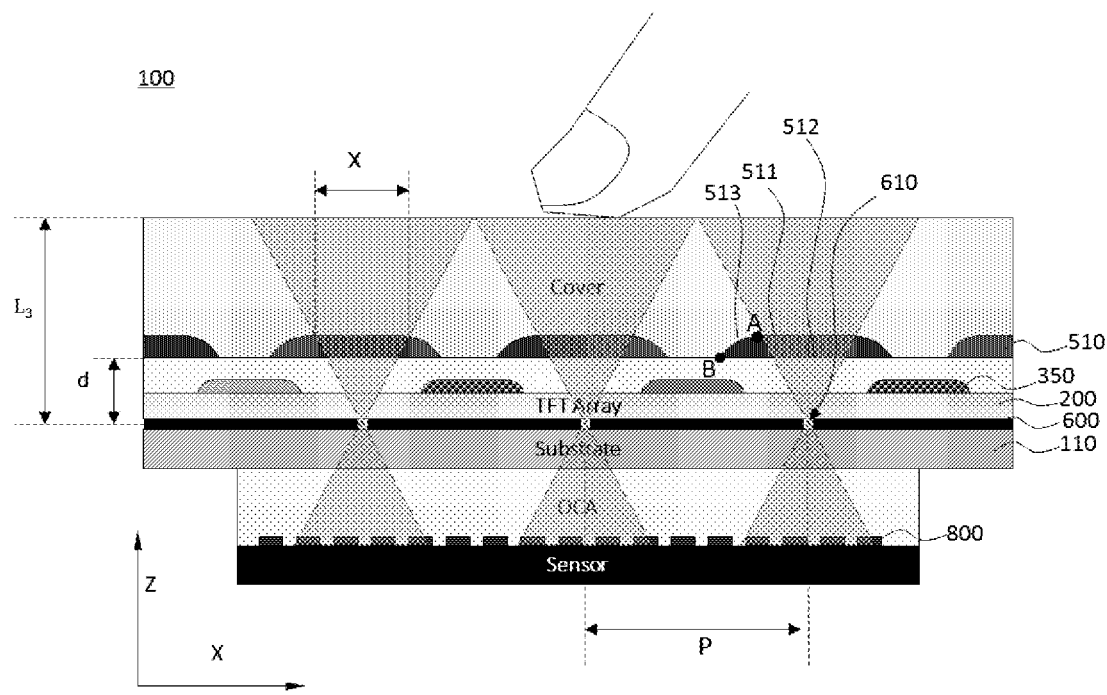
FIG. 9 illustrates a cross-sectional view of another exemplary display panel according to various disclosed embodiments of the present disclosure.

FIG. 8 is a partial top view of another exemplary display panel consistent with various disclosed embodiment of the present disclosure. FIG. 9 is a partial cross-sectional view of another exemplary display panel consistent with various disclosed embodiments of the present disclosure. The cross-sectional view may be understood in conjunction with FIGS. 1-2, and may be equivalent to the partial cross-sectional view along the A-A direction in FIG. 1 or FIG. 2, and the cross-section may be perpendicular to the plane where the display panel is located. The similarities between this embodiment and the above-mentioned embodiments may not be repeated.

As shown in FIGS. 8-9, in one embodiment, the light pass opening 610 may be an imaging aperture used for the pinhole imaging. For example, the light pass opening 610 may be set according to the principle of the pinhole imaging such that it may become an imaging aperture that may satisfy the realization of the pinhole imaging on the photosensitive device. Taking the detection of the fingerprint of the finger touching the touch surface of the display panel with a fingerprint detection function as an example, multiple light-emitting devices 350 in the display layer 300 may be multiplexed as a fingerprint identification light source. After the light generated by the light-emitting device 350 reaches the fingerprint and touches the contact surface, because the fingerprint valley and fingerprint ridge may reflect different degrees of light, the reflected light may enter the light sensor layer 800 through the imaging aperture (that is, the light pass opening 610). When the aperture of the light pass opening 610 is small enough, the fingerprint image may be imaged onto the light sensor layer 800 according to the principle of the pinhole imaging to realize the fingerprint identification.

In one embodiment, the aperture of the light pass opening 610 may be in a range between 5 µm and 20 µm to ensure that the light passing opening is small enough to realize the pinhole imaging. At the same time, the requirements of the process precision for forming the imaging aperture may be met, and the process difficulty may be reduced.

In one embodiment, because the imaging aperture may occupy a relatively small area, on the one hand, the space occupied by the display panel by itself may be minimized, and on the other hand, the sidewall of the first optical structure may be avoided more easily. Furthermore, it may be known from the principle of the pinhole imaging that the path of light reflected by the touch surface of the pinhole imaging may be not an orthographic projection to the plane where the vertical substrate is located. Therefore, when the touch surface is imaged, the plane where the first optical structure is located may not be covered, so it may not be affected by the patterned first optical structure. Thus, the interference light incident on the optical sensor layer may be reduced; and the reliability of the light extraction structure combined with the light sensing detection may be improved.

In one embodiment, the display panel 100 may further include a light sensor layer 800. The light sensor layer 800 may be located on the side of the first light-shielding member 600 away from the optical layer 500, and may be used to detect the image formed the imaging aperture.

In one embodiment, the display panel may further include a color filter layer (not shown in the figure) located on the side of the display layer away from the array layer. The color filter layer may include a black matrix (BM, black matrix) and a color resist. Because the color filter layer may include a black matrix, it may not transmit light across the entire surface. Therefore, the traditional light sensing detection may not be suitable. In the present disclosure, the light pass opening combining with the imaging aperture may no longer be limited to the light-transmitting area of the color filters. It may only be necessary to set an opening corresponding to the imaging aperture.

Further, referring to FIG. 8 and FIG. 9, in one embodiment, the light pass opening 610 may be arranged as an array along the first direction X and the second direction Y. The period of the adjacent light pass openings may be P.

In one embodiment, the configuration that the light pass openings 610 are arranged along the first direction X is taken as an example for description.

It is understandable that the period of evenly arranged components may refer to the distance between the centers of two adjacent components. For example, the period P of the light pass openings 610 may be the distance between the centers of two adjacent light pass openings 610.

In one embodiment, the period P of the light pass openings 610 may satisfy: P≤(L3×X)/d. L3 may be the vertical distance from the light pass opening 610 to the touch surface of the display panel 100, X may be the size of the top surface 511 of the first optical structure 510 in the first direction X, and d may be the vertical distance from the light pass opening 610 to the first optical structure 510. Such a configuration may ensure that the imaging aperture is not located in the opening area of the first optical structure 510.

In one embodiment, d may be the vertical distance from the light pass opening 610 to the top surface 511 of the first optical structure 510. It should be noted that the vertical distance mentioned in this embodiment is the distance along the third direction Z.

In such an embodiment, the reading range of the optical pass opening used for the pinhole imaging may not exceed the range covered by the top surface of the first optical structure at the position of the first optical structure. Accordingly, the image read by the light pass opening may avoid the interference of light reflected by the sidewall of the first optical structure as much as possible.

Further, in some other optional embodiments of the present disclosure, the imaging aperture may try to avoid the opening position of the first optical structure, and may usually be opened at the exact center position of the connection line of the pixels (light-emitting devices).

Figure 10:
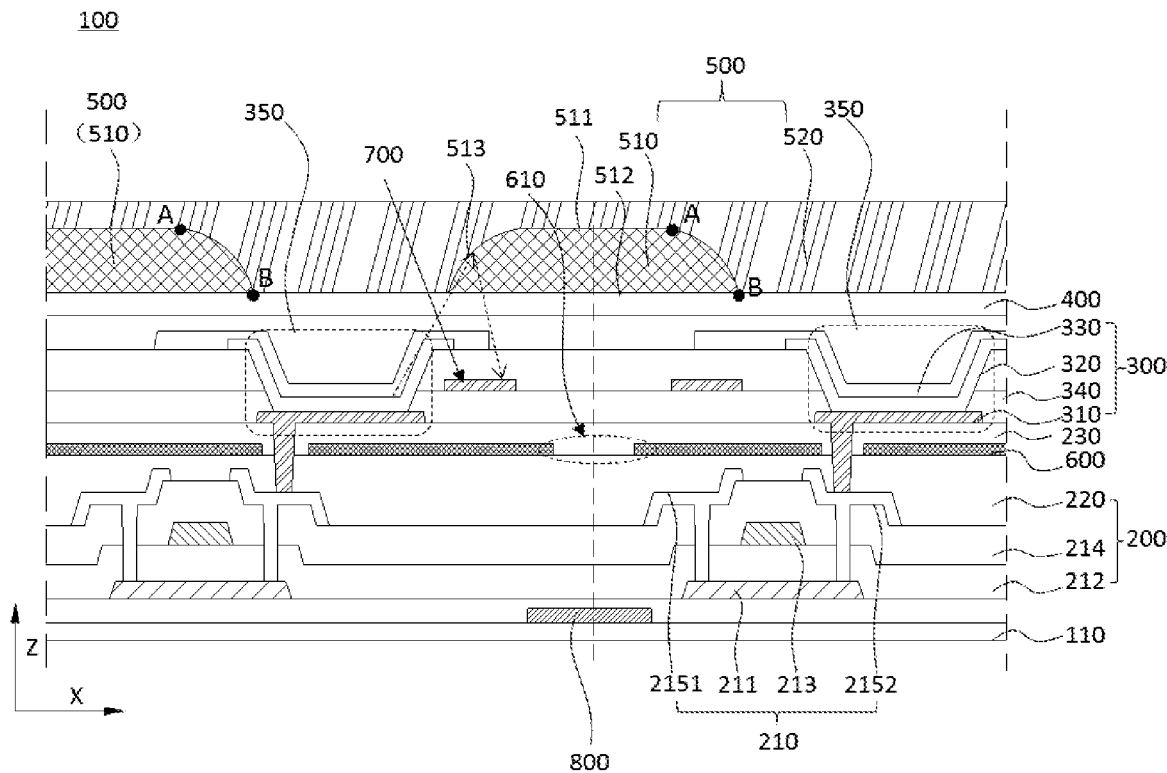
FIG. 10 illustrates a cross-sectional view of another exemplary display panel according to various disclosed embodiments of the present disclosure.
Figure 11:
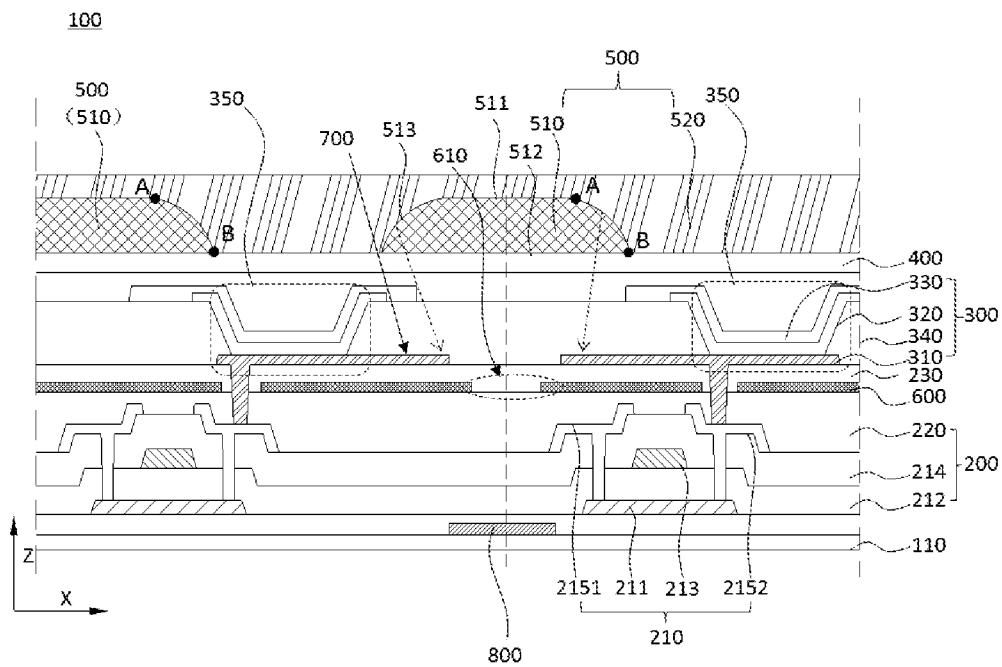
FIG. 11 illustrates a cross-sectional view of another exemplary display panel according to various disclosed embodiments of the present disclosure.

FIG. 10 and FIG. 11 are partial cross-sectional views of other exemplary display panels consistent with various disclosed embodiments of the present disclosure. These cross-sectional views may be understood in conjunction with FIGS. 1-2, and may be equivalent to the partial A-A sectional views of FIG. 1 and FIG. 2. The cross-section may be perpendicular to the plane where the display panel is located.

In one embodiment, the sidewall 513 of the first optical structure 510 may be a non-concave surface.

In one embodiment, the display panel 100 may further include an auxiliary light-shielding layer 700 disposed between the first light-shielding member 600 and the optical layer 500.

In one embodiment, the auxiliary light-shielding layer 700 may be made of a light-shielding material. Further, the auxiliary light-shielding layer 700 may be a black material, which may further absorb the reflected light, avoid light reflecting back and forth between the auxiliary light-shielding layer 700 and the optical layer, and further improve the accuracy of light sensing detection and the display effect of the display panel.

In one embodiment, the auxiliary light-shielding layer 700 may be an integrally formed surface structure and may include an opening exposing the light pass opening 610. In other words, the auxiliary light-shielding layer 700 may not block the light pass opening 610, and at the same time, it may not block the propagation path of the light information that needs to be read by the light pass opening 610.

In one embodiment, the auxiliary light-shielding layer 700 may further includes an opening exposing the light-emitting device 350.

Through such an embodiment, while ensuring the technical effects of the foregoing embodiments, it may also be possible to further prevent the sidewall of the first optical structure from reflecting light to the light pass opening and its vicinity. Thus, the interference light may be further blocked, and the accuracy of light sensing detection may be further improved.

In one embodiment, the auxiliary light-shielding layer 700 may overlap the sidewall 513 of the first optical structure 510. For example, the orthographic projection of the auxiliary light-shielding layer 700 on the substrate 110 may overlap the orthographic projection of the sidewall 513 of the first optical structure 510 on the substrate 110.

In one embodiment, the orthographic projection of the auxiliary light-shielding layer 700 on the substrate 110 may completely cover the orthographic projection of the sidewall 513 of the first optical structure 510 on the substrate 110.

In one embodiment, the sidewall 513 of the first optical structure 510 may be a concave arc surface, and the orthographic projection of the auxiliary light-shielding layer 700 on the substrate 110 may cover the condensing point of the orthographic projection of the sidewall 513 of the concave arc surface. For example, the sidewall 513 of the concave arc surface may be equivalent to forming a concave mirror, and the condensing point may be the focal point of the concave mirror.

In one embodiment, the condensing point of the sidewall 513 of the concave arc surface may be located on the film layer where the auxiliary light-shielding layer 700 is located. For example, the focal point of the concave mirror formed by the sidewall 513 is at the position where the auxiliary light-shielding layer 700 is located.

Through such a design, the concave arc sidewall 513 may converge the reflected light as much as possible, and at the same time, since the light converging position may just fall on the shielding position of the auxiliary light-shielding layer 700, the light may be reflected through the concave arc side wall to converge on the focal point in front of the mirror. Thus, using the sidewall, the interfering light may be concentrated as much as possible and may be shielded at same time, and the accuracy of the light detection may be effectively improved.

As shown in FIG. 11, when the light-emitting device 350 includes the anode layer 310 on the array layer 200, the auxiliary light-shielding layer 700 and the anode layer 310 may be on a same layer and made of a same material. For example, the anode layer of the light-emitting layer may be expanded such that its edge may at least cover the curved sidewall of the first optical structure. Further, because the first light-shielding layer 600 may be located on the side of the anode layer 310 away from the optical layer 500, for example, the first light-shielding layer 600 may be located on the side of the organic light-emitting material 320 away from the display surface of the display panel 100, thus it may not block the normal light emission of the display. Further, because the anode layer 310 may be closer to the sidewall 513 than the first light-shielding layer 600, it may capture the fingerprint image without blocking the light pass opening 610, and at the same time, the interference light reflected by the sidewall 513 may be blocked before reaching the light pass opening 610. At the same time, since the material of the anode layer itself may also be preferably a light-shielding material with a reflective function, the auxiliary light-shielding layer 700 and the anode layer 310 may be formed on the same layer and may be made of the same material. Thus, the cost may be reduced.

In one embodiment, the auxiliary light-shielding layer 700 may be extended from the anode layer 310 and is integrally formed with the anode layer 310. Thus, the fabrication process may be further simplified, the process steps may be reduced, and the cost may be reduced. At the same time, the accuracy of light sensing detection and the display effect of the display panel may be further improved.

Figure 12:
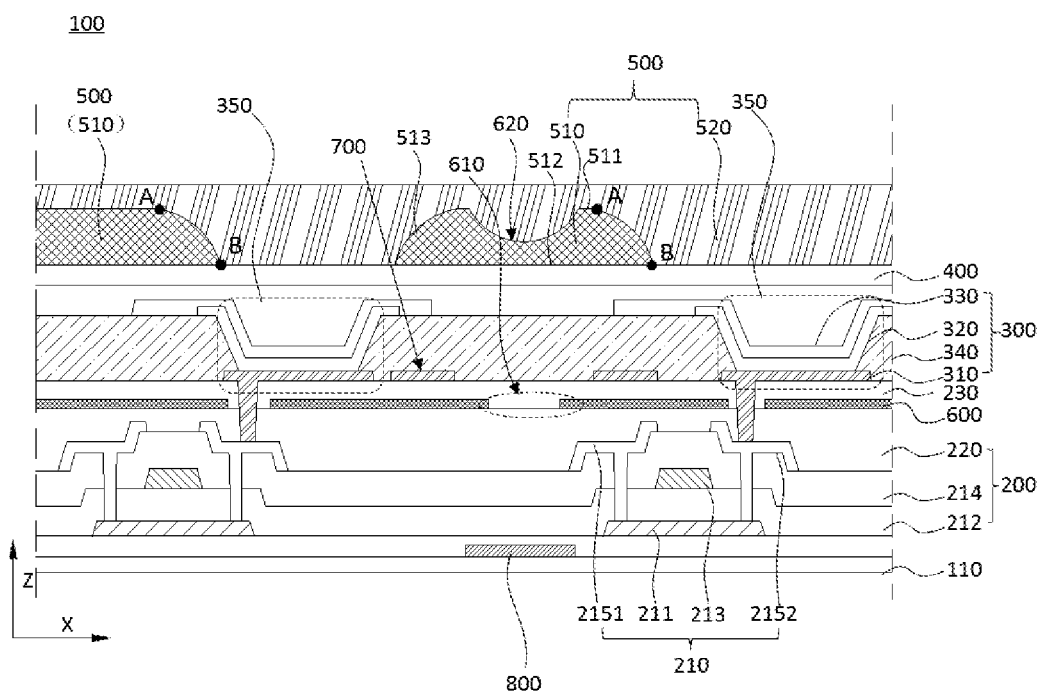
FIG. 12 illustrates a cross-sectional view of another exemplary display panel according to various disclosed embodiments of the present disclosure.
Figure 13:
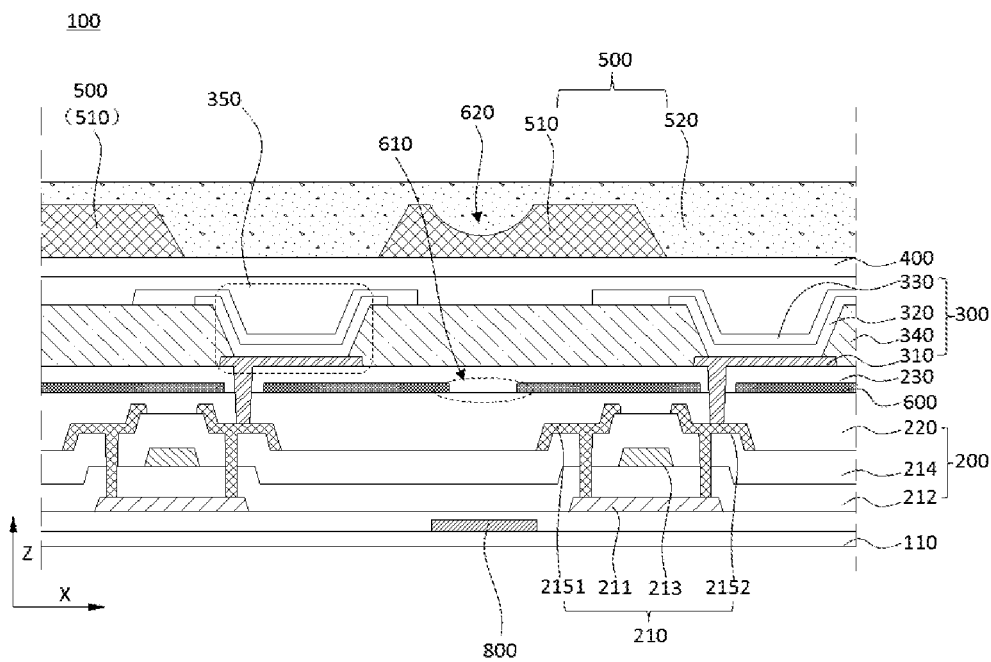
FIG. 13 illustrates a cross-sectional view of another exemplary display panel according to various disclosed embodiments of the present disclosure.

FIGS. 12-13 are respectively partial cross-sectional views of two other exemplary display panels consistent with various disclosed embodiments of the present disclosure. FIGS. 12-13 may be understood in conjunction with FIG. 1 and FIG. 2, respectively, and may be equivalent to a partial cross-sectional view along the AA direction in FIG. 1 or FIG. 2. The cross-section may be perpendicular to the plane where the display panel is located.

As shown in FIGS. 12-13, in one embodiment, the optical layer 500 may further include a second optical structure 520. The second optical structure 520 may be disposed correspondingly to the first optical structure 510 and the light-emitting device 350.

In one embodiment, the second optical structure 520 may be located on a side of the first optical structure 510 away from the display layer 300. In one embodiment, the second optical structure 520 may further include a portion covering the sidewall of the first optical structure 510 facing the light-emitting device 350 or a portion covering the light-emitting device 350. In this embodiment, the configuration that the optical layer further includes a second optical structure located on a side of the first optical structure away from the substrate as an example for description.

In one embodiment, the refractive index of the second optical structure 520 may be greater than the refractive index of the first optical structure 510. For example, the refractive index of the first optical structure 510 may be n1; the refractive index of the second optical structure 520 may be n2; and n1<n2. The interface reflection between the first optical structure 510 and the second optical structure 520 may change the direction of the large-angle light emitted by the light-emitting layer, reduce its luminous angle, increase the amount of light, increase luminous efficiency, and reduce the power consumption. Other similarities between the first optical structure 510 and the second optical structure 520 in this embodiment and the foregoing embodiments will not be repeated.

Differently, the top surface 511 of the first optical structure 510 may include a first groove 620, and at least a portion of the first groove 620 may be disposed corresponding to the light pass opening 610. For example, the light pass opening 610 may be provided corresponding to at least one first groove 620. For the light pass opening 610 and the first groove 620 disposed correspondingly, their orthographic projections on the substrate 110 may overlap. Furthermore, they may be arranged directly opposite along the third direction Z. For example, the geometric centers of the light pass opening 610 and the corresponding first groove 620 may coincide.

In one embodiment, the bottom surface of the first groove 620 may at least include an arc surface recessed toward the inside of the first optical structure 510.

In one embodiment, the first groove 620 may have a continuous arc surface as a whole. For example, the sidewall and the bottom surface of the first groove 620 may be both arc surfaces, and may form a continuous arc surface.

In one embodiment, at least a portion of the second optical structure 520 may fill the first groove 620. The refractive index of the second optical structure 520 may be greater than the refractive index of the first optical structure 510. Therefore, the second optical structure 520 in the first groove 620 may be equivalent to forming a convex lens. For example, right above the light pass opening 610 and on a relatively flat position of the first optical structure 510 (for example, within the coverage of the top surface 511), an arc structure as shown in FIG. 12 and FIG. 13 may be formed. Thus, the second optical structure 620 may form an arc-shaped protrusion protruding toward the substrate 110 at the first groove 620. Because the refractive index of the second optical structure 620 may be higher than the refractive index of the first optical structure 610, the protruding arc-shaped structure may be equivalent to a micro-convex lens; and may have the function of imaging. In one embodiment, a halftone process may be used to form this structure.

Through such an embodiment, the optical layer may be used to improve the effect of light sensing detection; and the manufacturing cost of the light sensing system may also be reduced.

Further, referring to FIG. 12 or FIG. 13, in one embodiment, the bottom surface 512 of the first groove 610 may include a concave arc surface. For example, at least the bottom surface 512 of the first groove 620 may be formed to be a recessed arc toward the inside of the first optical structure 510.

The curvature radius r of the arc surface may satisfy r<(n2−n1)u/2. n1 may be the refractive index of the first optical structure 510; n2 may be the refractive index of the second optical structure 520; u may be the vertical distance from the first groove 620 to the touch surface of the display panel 100. It should be noted that the vertical distance mentioned in this embodiment may the distance along the third direction Z.

Because the imaging interference between adjacent microlenses is not desired, u>2f (f is the focal length of the lens) may be required. The focal length of the microlens may be approximately expressed as 1/f=(n2−n1)/r. To ensure that the microlens imaging does not interfere with each other, the curvature radius of the microlens, i.e., the curvature radius r of the arc surface of the first groove 620, may need to be designed to be less than (n2−n1)u/2. Through the design of the present disclosure, it may be possible to further improve the accuracy of the light sensing detection while ensuring the improvement of the display effect of the display panel.

Figure 14:
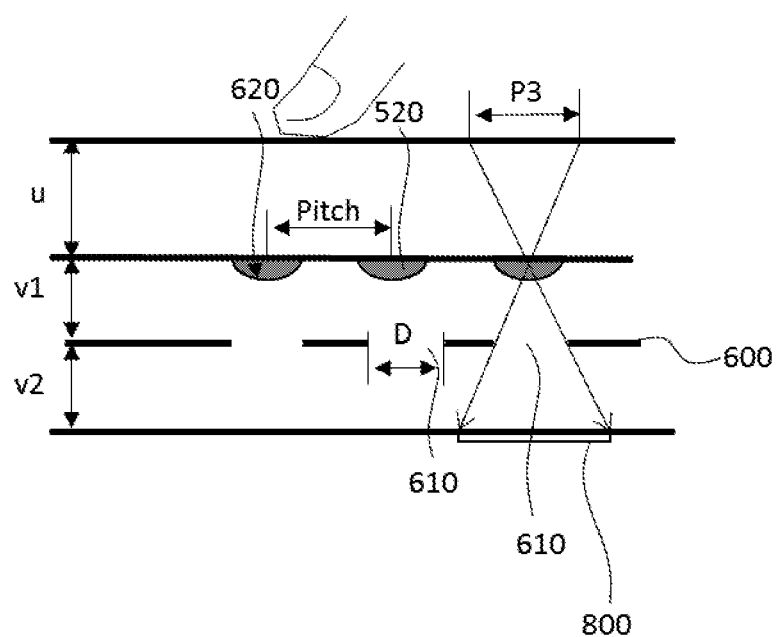
FIG. 14 illustrate an exemplary equivalent structure of FIG. 12 or FIG. 13.

FIG. 14 is an equivalent schematic diagram of FIG. 12 or FIG. 13. Referring to FIG. 12 or FIG. 13 in combination with FIG. 14, in one embodiment, the size D of the light pass opening 610 may satisfy D≥v1×p0/u. v1 may be the vertical distance from the first groove 620 to the light pass opening 610; p0 may be the period of the light pass opening 610; and u may be the vertical distance from the first groove 620 to the surface of the display panel 100.

It should be noted that the size D of the light pass opening 610 in this embodiment may refer to the length of the light pass opening 610 on the plane where the display panel is located, and this embodiment takes its length along the first direction X as an example for description. The vertical distance mentioned in this embodiment may be the distance along the third direction Z. The period mentioned in this embodiment may be understood as the interval between the geometric centers of two adjacent structures in a cyclically arranged structure, and may not refer to the minimum distance between the two.

In one embodiment, p0=Pitch. Pitch may be the period of the first grooves 620. For example, the period of the light pass openings 610 may be equivalent to the period of the first grooves 620 (i.e., the first groove of the non-assisted groove).

In one embodiment, the upper limit of the size D of the light pass opening 610 may satisfy p0/(1+v2/v1)≥D.

Through such an embodiment, it is possible to prevent the crosstalk between adjacent microlenses in imaging, and at the same time to ensure that the light pass opening may read the complete information on the touch surface.

Figure 15:
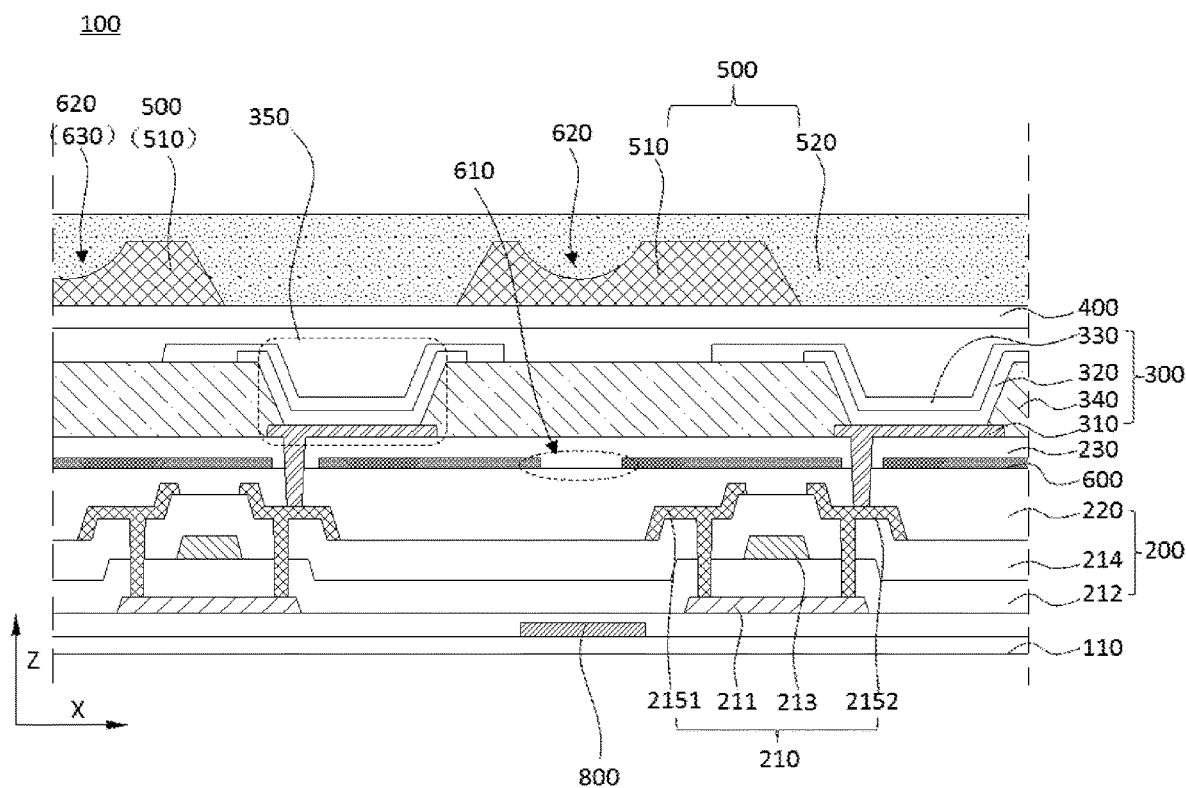
FIG. 15 illustrates a cross-sectional view of another exemplary display panel according to various disclosed embodiments of the present disclosure.

FIG. 15 is a partial cross-sectional view of another exemplary display panel consistent with various disclosed embodiments of the present disclosure. FIG. 15 may be understood in conjunction with FIGS. 1-2, and may be equivalent to the partial cross-sectional view along A-A direction in the FIG. 1 or FIG. 2. The cross-section may be perpendicular to the plane where the display panel is located.

As shown in FIG. 15, and referring to FIGS. 1-2, the first grooves 620 may be arranged as an array on the entire display panel 100. For example, the microlenses formed by the second optical structure 620 may be arranged as an array on the display panel.

In one embodiment, the first grooves 610 may be evenly arranged in the display panel 100. For example, the microlenses formed by the second optical structure 620 may be evenly arranged in the display panel.

In one embodiment, the first groove 620 may further include an auxiliary groove 630 that may not correspond to the light pass opening 610. In this way, the first grooves 620 may be made uniform, and the problem of visible patterns may be prevented.

In one embodiment, the first grooves 620 and the light-emitting devices 350 may be evenly arranged correspondingly. For example, there may be at least one first groove 620 adjacent to each light-emitting device 350, and such a first groove 620 may be an auxiliary groove 630 or a first groove 620 corresponding to the light pass opening 610. Because the first groove may be filled with the material of the second optical structure, which may be equivalent to an optical structure, the design of this embodiment may ensure that the pixels in each area have the same light output effect.

Figure 16:
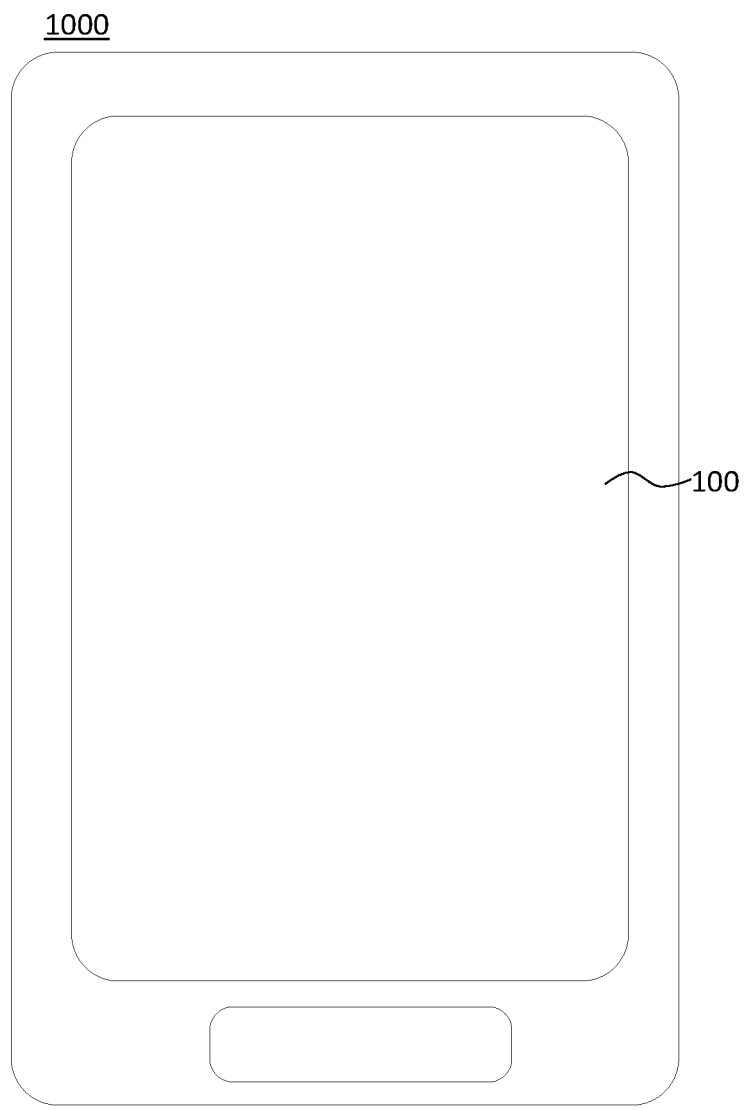
FIG. 16 illustrates an exemplary display device according to various disclosed embodiments of the present disclosure.

The present disclosure also provides a display device. The display device may include a display panel provided by the present disclosure. FIG. 16 is a schematic structural diagram of an exemplary display device consistent with various disclosed embodiment of the present disclosure.

As shown in FIG. 16, the display device 1000 may include a display panel 100. The display panel 100 may be a display panel provided by any one of the above-mentioned embodiments of the present disclosure. The embodiment of FIG. 16 only takes a mobile phone as an example to illustrate the display device 1000. It is understandable that the display device provided by the embodiment of the present disclosure may be a computer, a television, a vehicle-mounted display device, and other display devices with display functions. The disclosure does not impose specific restrictions on this. The display device provided by the embodiment of the present disclosure may have the beneficial effects of the display panel provided by the embodiment of the present disclosure. For details, reference may be made to the specific description of the display panel in the foregoing embodiments, and details are not described herein again in this embodiment.

The above content is a further detailed description of the present disclosure in conjunction with specific preferred embodiments, and it cannot be considered that the specific implementation of the present disclosure is limited to these descriptions. For those of ordinary skill in the technical field to which the present disclosure belongs, several simple deductions or substitutions can be made without departing from the concept of the present disclosure, which should be regarded as falling within the protection scope of the present disclosure.

What is claimed is:

1. A display panel, comprising:
   a substrate;
   an array layer on the substrate;
   a display layer located on a side of the array layer away from the substrate, wherein the display layer includes a plurality of light-emitting devices;
   an optical layer located on a side of the display layer away from the array layer, wherein the optical layer includes a first optical structure, and at least a portion of the first optical structure is arranged corresponding to intervals between the plurality of light-emitting devices; and
   a light-shielding member located on a side of the optical layer facing the substrate, wherein the light-shielding member includes a light pass area, and the light pass area and the first optical structure overlap each other.

2. The display panel according to claim 1, wherein:
   the light pass area does not overlap a sidewall of the first optical structure.

3. The display panel according to claim 1, wherein:
the first optical structure does not overlap a periphery of the plurality of light-emitting devices adjacent to the light pass area.

4. The display panel according to claim 1, wherein:
a sidewall of the first optical structure is a non-concave surface.

5. The display panel according to claim 4, wherein:
the sidewall of the first optical structure is a convex arc surface.

6. The display panel according to claim 4, wherein:
the sidewall of the first optical structure includes an upper end adjacent to a light-exiting surface of the display panel and a lower end away from the light-exiting surface of the display panel;
an extension line of a connection line between the lower end and a light-emitting device of the plurality of light-emitting devices includes a first extension line; and
the upper end is located on the first extension line, or located on a side of the first extension line facing the light-exiting surface of the display panel.

7. The display panel according to claim 4, wherein:
a distance $L_2$ from the first optical structure to a light-emitting device of the plurality of light-emitting devices satisfies $L_2 \geq h_2 \times L_1/h_1$,
wherein $L_1$ is a lateral distance between an upper end and a lower end of the sidewall of the first optical structure, $h_1$ is a thickness of the first optical structure, and $h_2$ is a vertical distance between the light-emitting device and the first optical structure.

8. The display panel according to claim 1, wherein:
the light pass area is used as an imaging pinhole for a pinhole imaging.

9. The display panel according to claim 1, wherein:
a period of light pass areas is P; and
P satisfies $P \leq (L_3 \times X)/d$,
wherein $L_3$ is a distance between the light pass area and a touch surface of the display panel, X is a size of a top surface of the first optical structure, and d is a distance between the light pass area and the top surface of the first optical structure.

10. The display panel according to claim 1, wherein:
a top surface of the first optical structure includes a first groove;
the light pass area corresponds to at least one first groove;
the optical layer also includes a second optical structure located on a side of the first optical structure away from the substrate;
at least a portion of the second optical structure fills the first groove; and
a refractive index of the second optical structure is greater than a refractive index of the first optical structure.

11. The display panel according to claim 10, wherein:
a bottom surface of the first groove includes a concave arc surface; and
the curvature radius r of the arc surface satisfies $r<(n2-n1) \times u/2$,
wherein n1 is a refractive index of the first optical structure, n2 is a refractive index of the second optical structure, u is a distance from the first groove to a touch surface of the display panel.

12. The display panel according to claim 10, wherein:
a size D of the light pass area satisfies $D \geq v_1 \times p_0/u$,
wherein $v_1$ is a distance between the first groove and the light pass area, $p_0$ is a period of the light pass area, and u is a distance between the first groove and a touch surface of the display panel.

13. The display panel according to claim 10, wherein:
the first groove also includes an auxiliary groove not corresponding to the light pass area; and
the first groove and the plurality of light-emitting devices are correspondingly and uniformly distributed.

14. The display panel according to claim 1, further comprising:
an auxiliary light-shielding layer located between the light-shielding member and the optical layer,
wherein the auxiliary light-shielding layer includes an opening exposing the light pass area.

15. The display panel according to claim 14, wherein:
the plurality of light-emitting devices include an anode layer located on the array layer; and
the auxiliary light-shielding layer and the anode layer are located in a same layer and made of a same material.

16. The display panel according to claim 14, wherein:
an orthogonal projection of the auxiliary light-shielding layer on the substrate overlaps an orthogonal projection of the sidewall of the first optical structure on the substrate.

17. The display panel according to claim 1, further comprising:
an optical sensor, disposed on a side of the light-shielding member away from the optical layer and configured to detect a light passing through the light pass area.

18. The display panel according to claim 1, wherein:
the first optical structure includes a transparent material.

19. The display panel according to claim 1, wherein:
the light-shielding member is made of a metal material.

20. The display panel according to claim 1, wherein:
the light-shielding member is formed by multiplexing other metal layers in the array layer.

21. A display device, comprising the display panel according to claim 1.

22. A display panel, comprising:
a substrate;
an array layer on the substrate;
a display layer located on a side of the array layer away from the substrate, wherein the display layer includes a plurality of light-emitting devices; and
an optical layer located on a side of the display layer away from the array layer, wherein the optical layer includes a first optical structure, and at least a portion of the first optical structure is arranged corresponding to intervals between the plurality of light-emitting devices;
wherein the array layer includes a light pass area, the light pass area and an anode layer of the plurality of light-emitting devices do not overlap, and the light pass area and the first optical structure overlap each other.

23. A display panel, comprising:
a substrate;
an array layer on the substrate;
a display layer located on a side of the array layer away from the substrate, wherein the display layer includes a plurality of light-emitting devices;
an optical layer located on a side of the display layer away from the array layer, wherein the optical layer includes a first optical structure, and at least a portion of the first optical structure is arranged corresponding to intervals between the plurality of light-emitting devices; and
a light sensor layer, disposed on a side of an anode layer of the plurality of light-emitting devices away from the optical layer, wherein the array layer includes a first area, the first area and the anode layer do not overlap, the first area and the first optical structure overlap each other, and the first area and the light sensor layer overlap each other.

* * * * *